United States Patent [19]

Takahashi et al.

[11] Patent Number: 5,196,732
[45] Date of Patent: Mar. 23, 1993

[54] STEP VOLTAGE GENERATOR

[75] Inventors: Akira Takahashi; Masanori Hirano; Teruo Takeshita, all of Hamamatsu, Japan

[73] Assignee: Hamamatsu Photonics K.K., Hamamatsu, Japan

[21] Appl. No.: 628,847

[22] Filed: Dec. 11, 1990

[30] Foreign Application Priority Data

Jan. 12, 1990 [JP]  Japan .................................. 2-005767

[51] Int. Cl.⁵ ........................ H03K 4/02; H03D 1/20
[52] U.S. Cl. ................................... 307/227; 307/261; 328/186
[58] Field of Search ............... 307/227, 264, 268, 261, 307/318; 328/186, 14

[56] References Cited

U.S. PATENT DOCUMENTS

| | | | |
|---|---|---|---|
| 2,920,217 | 1/1960 | House | 307/227 |
| 3,335,293 | 8/1967 | Horgan | 307/318 |
| 3,435,257 | 3/1969 | Lawrie, Jr. | 307/291 |
| 3,525,941 | 8/1970 | Smith | 328/186 |
| 3,869,659 | 3/1975 | Doong et al. | 307/227 |
| 3,932,772 | 1/1976 | Graves et al. | 307/227 |
| 4,205,241 | 5/1980 | Fisher et al. | 328/14 |
| 4,446,436 | 5/1984 | Ireland | 328/14 |
| 4,447,747 | 5/1984 | LaPotin | 307/529 |
| 4,682,061 | 7/1987 | Donovan | 307/318 |

FOREIGN PATENT DOCUMENTS 0094622 11/1983 European Pat. Off. .
804628 11/1958 United Kingdom .

Primary Examiner—William L. Sikes
Assistant Examiner—Toan Tran
Attorney, Agent, or Firm—Cushman, Darby & Cushman

[57] ABSTRACT

A step voltage generator for outputting a step voltage from an output terminal. The step voltage generator includes a voltage dividing circuit having a plurality of dividing elements serially connected to each other and disposed between two power sources of different voltage levels for voltage dividing the potential difference between the two power sources. The step generator further includes a switching circuit having a plurality of switch devices serially connected to each other and similarly disposed between the two power sources. The end switch device of the serially connected bunch is connected to the output terminal. A trigger circuit turns on the switch devices sequentially starting with the one closest to the output terminal. A plurality of reverse flow preventive circuits prohibit current through a switch device most recently turned on from flowing through a voltage dividing element previously turned on and which remains on.

18 Claims, 9 Drawing Sheets (1)    (2)    (3)

(1) (2) (3) (4) (5) (6) (7) (8)

STEP VOLTAGE GENERATOR

DETAILED DESCRIPTION OF THE INVENTION

1. Field of the Invention

This invention relates to a step voltage generator which can be suitably used in, e.g., framing cameras.

2. Related Background Art

There have been conventionally proposed various circuits as step voltage generators. According to, e.g., Yasuo Suzuki, "Tokkyo Pulse Kairo Gijutu Jiten (Dictionary of Patent Pulse Circuit Techniques)", Ohmusha, Tokyo, Ps. 298-307, the conventionally known step voltage generators are classified into the following four groups.

A) A step voltage generator which switches voltage values by a rotary switch or a D-A converter for generating a step voltage;

B) A step voltage generator which adds waveforms as of a square wave, a sawtooth wave, etc. for generating a step voltage;

C) A step voltage generator which integrates clock pulses using a storage counter for generating a step voltage; and D) A step voltage generator which uses a special device, such as an Esaki diode, a thermistor or others, for generating a step voltage.

A step voltage generator suitably used in a framing camera requires a step waveform of high voltages to be generated in extra-short rise and fall times, i.e., the characteristic of high voltage and high speed. In view of this characteristic, the step voltage generator of the voltage-switching type (A) has been conventionally used for this use, and includes a device, such as triodes, avalanche transistors, delay lines or others.

A process for generating a step voltage applied to framing cameras is described in, e.g., U.S. Pat. No. 3,887,841 Jun. 3, 1975) in which a sawtooth voltage and a lamp voltage are composed of. This process will be explained below with reference to FIGS. 1, 2A, 2B, 2C and 2D. A beam to be measured 111 forms an image on the photoelectron-emissive cathode (photo cathode) 112 of a streak tube 113 through a lens 110. A number of photoelectrons corresponding to an incident amount of the beam is emitted by the photoelectron emissive surface 112. At this time, a pulse voltage is supplied by a blanking circuit 129, and the photoelectrons are accelerated by a potential difference $V_{SG}$-$V_{SP}$ between the photocathode 112 and the grid 114. The photoelectrons are further accelerated by an anode 115 and pass deflection electrodes 117 and 119 to be incident on a fluorescent screen 120.

The deflection electrodes 117 are supplied with a sawtooth voltage (FIG. 2A) by a sawtooth voltage generator 124, and the deflection electrodes 119 are supplied with a lamp voltage (FIG. 2B) by a lamp voltage generator 126. The lamp voltage generator 126 is connected to a trigger circuit 127.

The photoelectrons pass these two pairs of deflection electrodes 117, 119 to have the same effect as when deflected by the step voltage of FIG. 2C.

Since the photocathode 112 is supplied with a gate pulse, images in the periods of time (1), (2) and (3) of FIG. 2D are formed on the fluorescent screen 120 at spaced positions from each other. That is, fluorescent image in the periods of time (1), (2) and (3) of FIG. 2D are formed on positions (1), (2) and (3) on the fluorescent screen 120 in FIG. 1.

But it is difficult to correctly match an inclination of the waveform of a sawtooth voltage with that of a lamp voltage by the above-described step voltage generating technique of the U.S. patent. Consequently the flatness of a step voltage composed of a sawtooth voltage and a lamp voltage is lowered, and using such step voltage the framing camera of FIG. 1 cannot form accurate images. Step voltage generators of the type (B) to (D) of the above-described techniques can generate sharply rising step voltages but cannot satisfy the requirement of high voltage and high speed. The techniques of combining waveforms using a storage counter and using a special device have the problem that the flatness of a step voltage is lowered depending on time constants of the devices with the result of poor resolution of the framing camera. On the other hand, I. F. Kalinkevich et. al., "Pribody i Tekhnika Eksperimenta, No. 2, pp. 106–109, Mar.-Apr., 1980." by Physicotechnical Institute of the Academy of sciences of the USSR, Leningrad, describes a high-voltage step voltage generator including a low-voltage programmable device and a high-voltage programmable amplifier. S. M. Sriraghavan et al. published a method of generating three-phase stepped-voltage waveforms using eight thyristor power switches, in IEEE Transactions on Industrial Electronic and Control Instrumentation, Vol. IEC1-28, No. 3, August, 1981. T. G. Cole et al. published a cup and bucket circuit for generating a stepped voltage waveform necessary to drive a CRT in IBM Technical Disclosure Bulletin, vol. 26, No. 10B, March, 1984. None of these prior art can satisfy all the three requirements of generating a high step voltage at high speed, a rise and a fall from a step to the next step being performed in extra-short periods of time, and a constant voltage being obtained in each step (i.e., high flatness).

An object of this invention is to provide a step voltage generator which can generate at high speed high voltages very sharply rising and falling, and have high flatness.

SUMMARY OF THE INVENTION

The step voltage generator according to this invention comprises voltage dividing means comprising a plurality of dividing elements serially connected to each other between two power sources of different voltage levels from each other, and dividing a potential difference between the two power sources into a plurality of levels of voltage, switch means comprising a plurality of switch devices serially connected to each other between the two power sources, that of the switch devices on the side of one of the two power sources being connected to the output terminal, trigger means for turning on the switch devices sequentially from that thereof on the side of the output terminal, and reverse flow preventive means for prohibiting a current flowing through that of the switch devices which is currently turned on from flowing through that of the voltage dividing elements corresponding to that of the switch devices which has been already turned on.

According to this invention, a source voltage is divided into a plurality of voltage levels by voltage dividing means, and a plurality of switch devices are sequentially turned on so as to sequentially output divided voltage of a plurality of levels.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 8 is a block diagram of a framing camera the step voltage generator according to this invention is applied to.

DESCRIPTION OF THE PREFERRED EMBODIMENT

Figure 1:
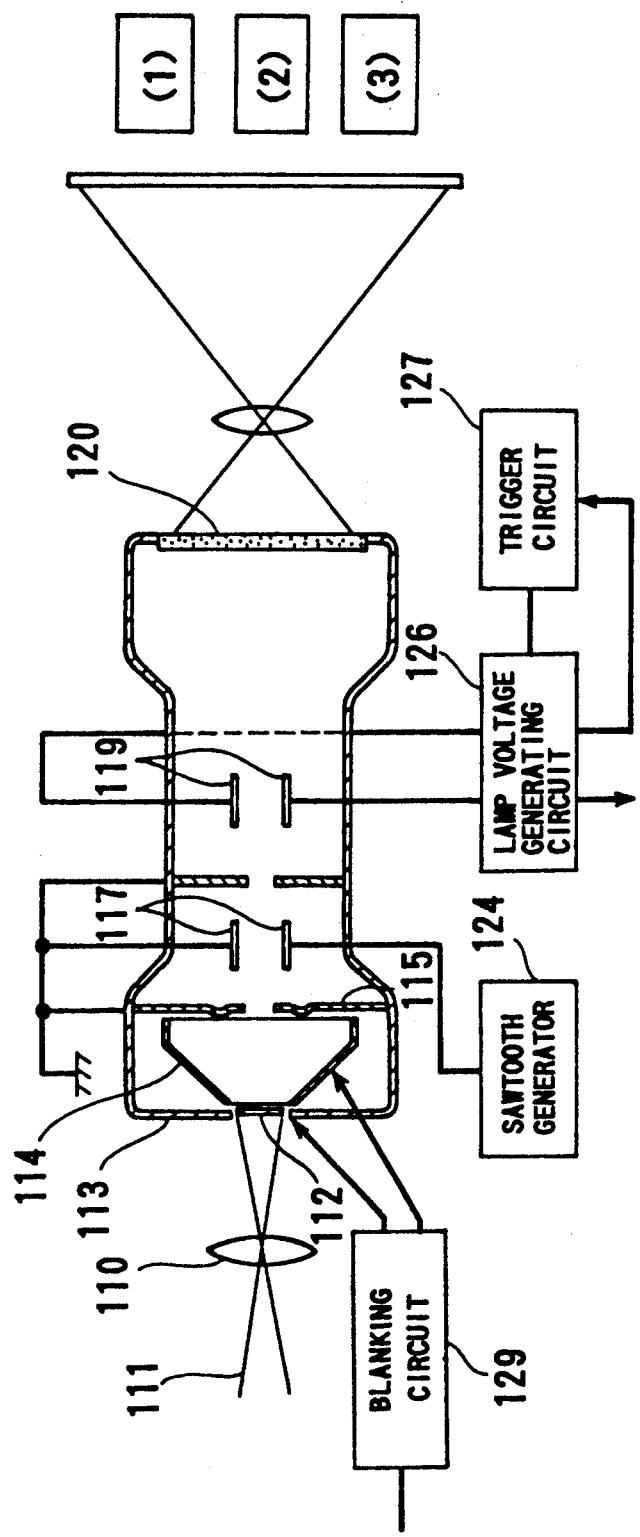
FIG. 1 is a block diagram of a framing camera of FIG. 1 using a conventional step voltage generating technique.
Figure 2A:
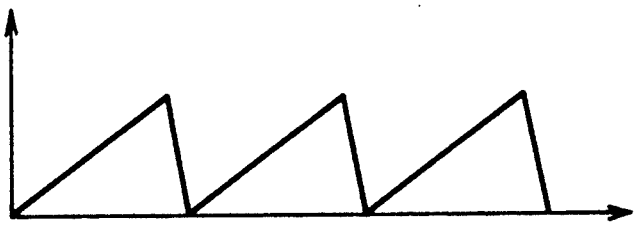
FIGS. 2A, 2B, 2C and 2D are timing charts of the operation of the framing camera.
Figure 2B:
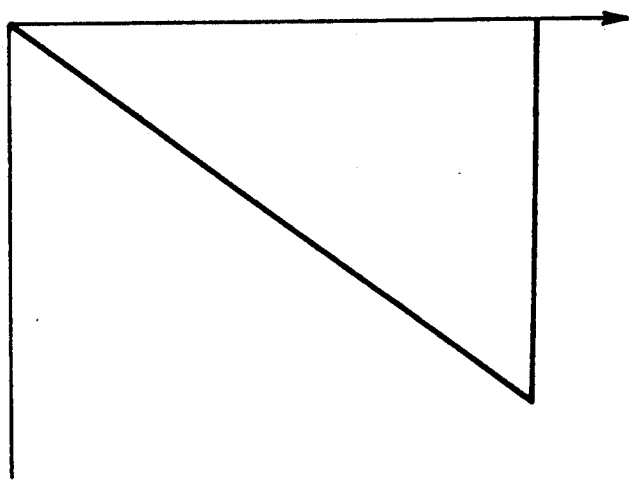
Figure 2C:
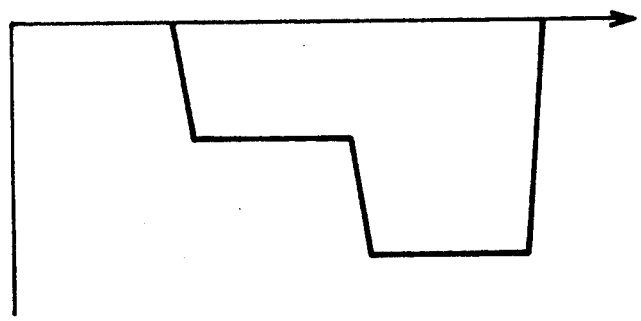
Figure 2D:
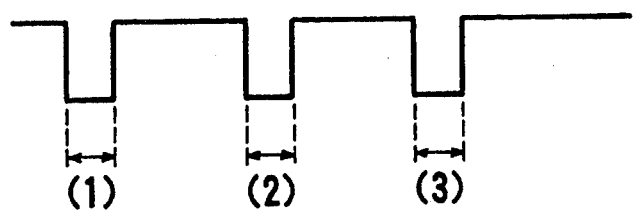
Figure 3:
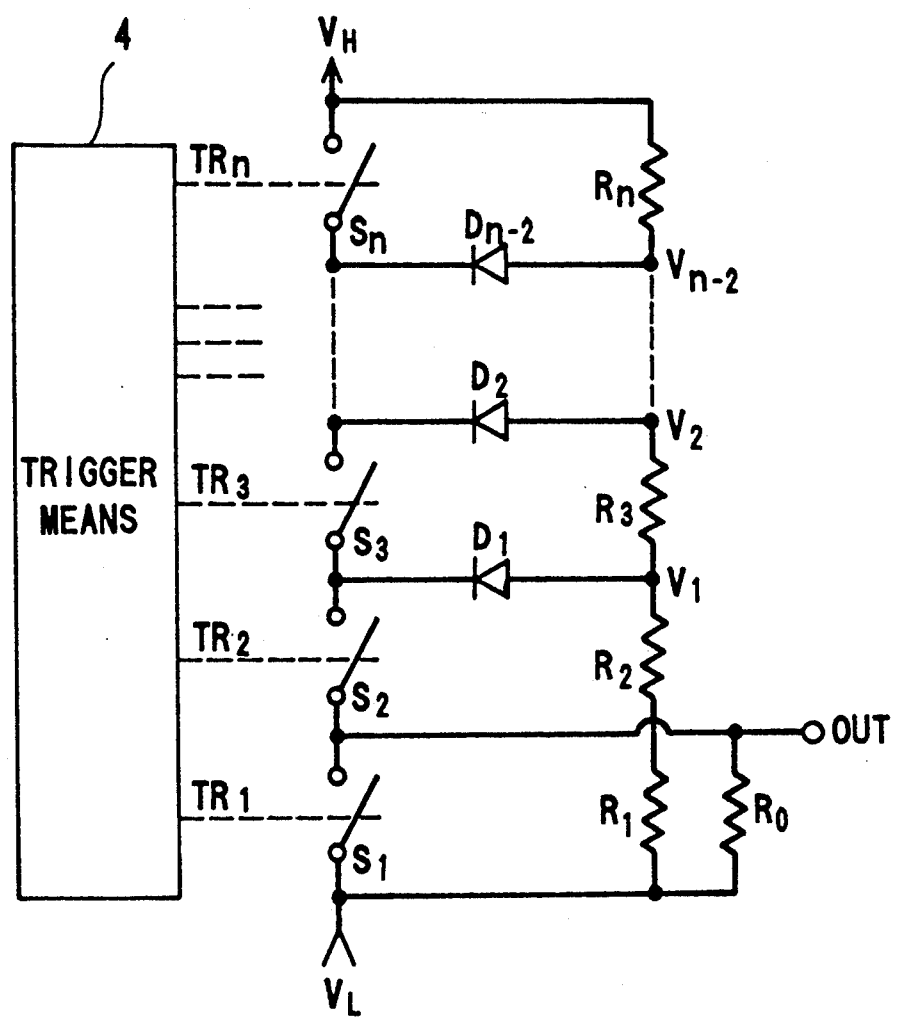
FIG. 3 is a basic block diagram of the step voltage generator according to a first embodiment of this invention.

As shown in FIG. 3, voltage dividing means comprises n-resisters serially connected to each other $R_1+R_2, R_3, R_4, \ldots R_n$, and these resistors are inserted between a higher-level power source $V_H$ and a lower-level power source $V_L$. A potential difference $V_H-V_L$ between these power sources is divided by the respective resistors $R_1+R_2, R_3, R_4, \ldots R_n$, and divided voltages $V_1, V_2, \ldots, V_{n-2}$ are obtained. Switching means for stepping an output voltage comprises n-switch devices $S_1, S_2, S_3, \ldots, S_n$ serially connected to each other which are provided by, e.g., FETs or bipolar transistors. The switch device $S_1$ functions as a reset switch. This serial circuit of the switches $S_2$ to $S_n$ is inserted between the power sources $V_H, V_L$. The intermediates between the resistors are connected to the intermediates between the switch devices by reverse current preventive diodes $D_1$ to $D_{n-2}$. The intermediate between the switch devices $S_1, S_2$ is connected to an output terminal OUT. A resistor $R_0$ is inserted between the output terminal OUT and the power source $V_L$. The switch devices $S_1$ to $S_n$ are turned on by trigger signals $TR_1$ to $TR_n$ from the trigger means 4. The trigger means 4 comprises an ECL circuit or a TTL circuit.

Figure 4A:
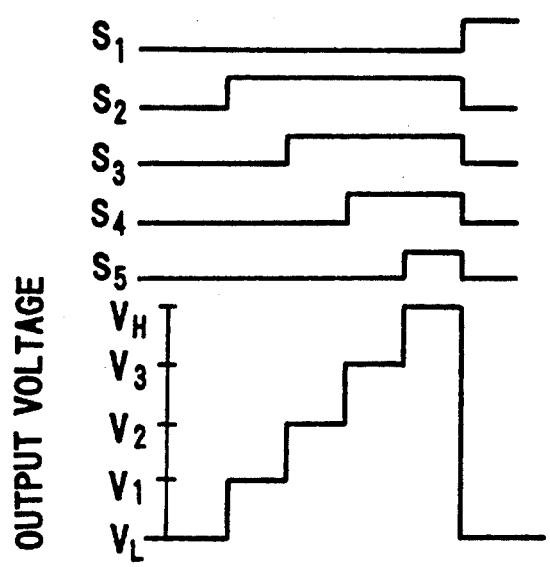
FIGS. 4A and 4B are timing charts of the operation of the step voltage generator according to the first embodiment.
Figure 4B:
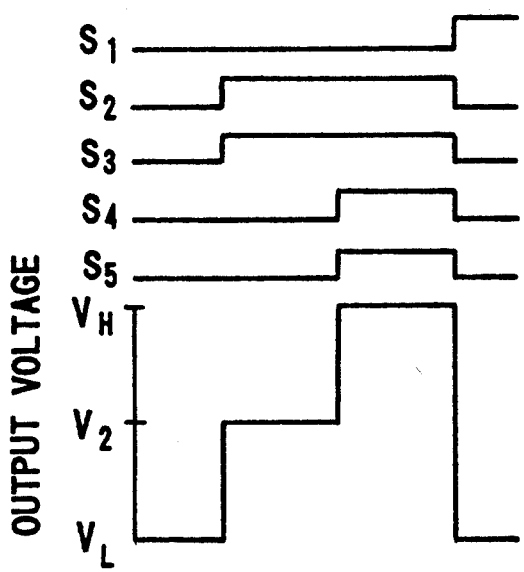

The above-described step voltage generator operates as shown by the timing chart of FIGS. 4A and 4B.

Here it is assumed that the total number of the switch devices $S_1$ to $S_n$ is 5 (n=5), and the voltage levels to be outputted as a step voltage is totally 5, i.e., divided voltages $V_1$ to $V_3$ and the two levels of the power sources $V_H, V_L$. When all the switch devices $S_1$ to $S_5$ are off, as shown in FIG. 4A, the output terminal OUT is connected to the power source $V_L$ through the resistor $R_0$, and the output level $V_{OUT}$ is $V_L$. Only the switch device $S_2$ is turned on by a trigger signal $TR_2$, the output level $V_{OUT}$ becomes $V_1$. When the switch device $S_2$ in addition to the switch device $S_3$ is turned on by a trigger signal $TR_3$, the output level $V_{OUT}$ becomes $V_2$. At this time, the output level $V_2$ is higher than the output level $V_1$, and the diode $D_1$ has a reverse bias and prohibits the reverse flow of a current. When the switch device $S_4$ is turned on by a trigger signal $TR_4$ in addition to the switch devices $S_2$, $S_3$, the output level $V_{OUT}$ becomes $V_3$. Furthermore, when the switch h device $S_5$ as well is turned on by a trigger signal $TR_5$, the output level $V_{OUT}$ become the same level as the power source $V_H$. Finally when the resetting switch device $S_1$ is turned on by a trigger signal $TR_1$, the output terminal OUT is short-circuited with the power source $V_L$ to be $V_{OUT}=V_L$. At this time, the switch devices $S_2$ to $S_5$ for stepping a voltage are turned off, and the power sources $V_H, V_L$ are never short-circuited through the serial circuit of the switch devices $S_1$ to $S_5$. Thus, a four-step voltage is obtained at the output terminal OUT.

On the other hand, when the switch devices $S_2$, $S_3$ are concurrently turned on, as shown in FIG. 4B, the output level $V_{OUT}$ is raised from a level of the power source $V_L$ to $V_2$. Consecutively when the switch devices $S_4$, $S_5$ are turned on, the output level $V_{OUT}$ is raised from $V_2$ to a level of the power source $V_H$. Accordingly, in this case a two-step voltage different from that of FIG. 4A both in step width and step height can be obtained.

According to this invention, the switch device S is provided by a device which can realize high-speed switching in the so-called switching mode, such as a field-effect transistor (FET) or bipolar transistor (BPT), whereby a high-speed step voltage equal to or less than 10 nano-second (ns) can be obtained. Furthermore, the step width can be varied easily only by changing a timing of triggering the switch device S. In addition, the output voltage of each step is a divided voltage generated by the voltage dividing means, so that very good flatness can be obtained. Furthermore, the step voltage generator may comprise devices which have high voltage resistant to a high voltages equal to or higher than 1 kV, such as FETs, diodes, resistors, etc., so that high step voltage can be easily obtained.

Figure 5:
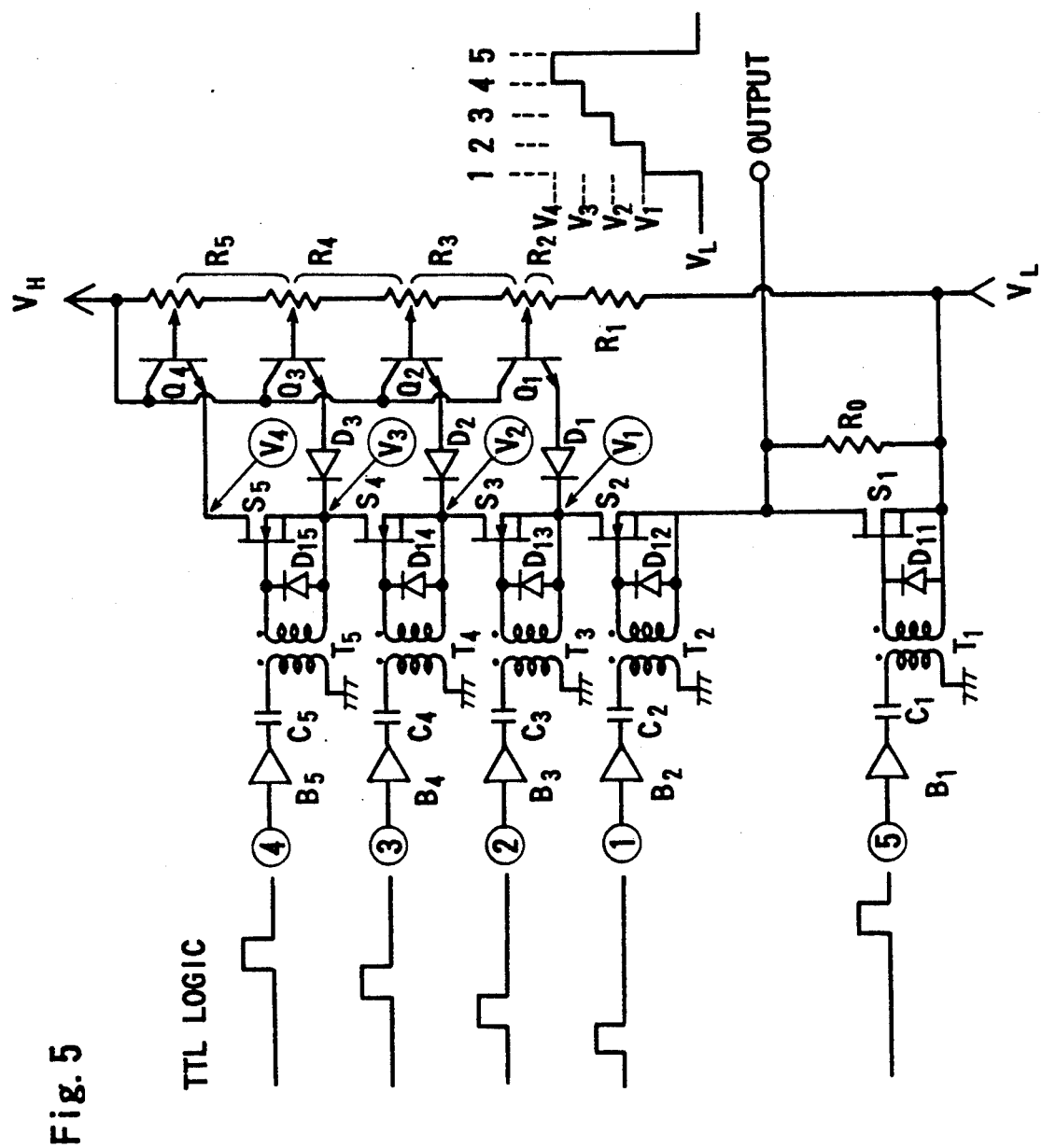
FIG. 5 is a block diagram of the step voltage generator according to a second embodiment of this invention.

FIG. 5 shows the step voltage generator according to a second embodiment of this invention.

In this embodiment, the voltage dividing means comprises a fixed resistor $R_1$, and variable resistors $R_2$ to $R_5$ so that the levels of the divided voltages $V_1$ to $V_4$ are variably set. The output impedance of the voltage dividing means is lowered by using a current buffer comprising bipolar transistors $Q_1$ to $Q_4$. The reset switch $S_1$ and the switch devices for stepping a voltage $S_2$ to $S_5$ are provided by FETs, and a diode $D_{11}$ to $D_{15}$ is connected to each FET between the source and the drain, whereby the switch device $S_1$ to $S_5$ is protected from a reverse current. The switch devices $S_1$ to $S_5$, and the trigger means 4 are interconnected by pulse transformers $T_1$ to $T_5$, to thereby enable floating from the power sources. Trigger signals $TR_1$ to $TR_5$ from the trigger means 4 are supplied to the gates of the respective FETs as the switch devices through buffers $B_1$ to $B_5$ and condensers $C_1$ and $C_5$.

The circuit of FIG. 5 operates in accordance with the timing charts of FIGS. 4A and 4B. In a sample prepared by the inventors, with a level of the power source $V_H$ being +500 V, and that of the power source $V_L$ being −500 V, a step voltage of 250 V was obtained. The rise time of the step voltage was around 10 ns, and its flatness was ± some voltages. The repetitive frequency was 10 KHz.

Figure 6:
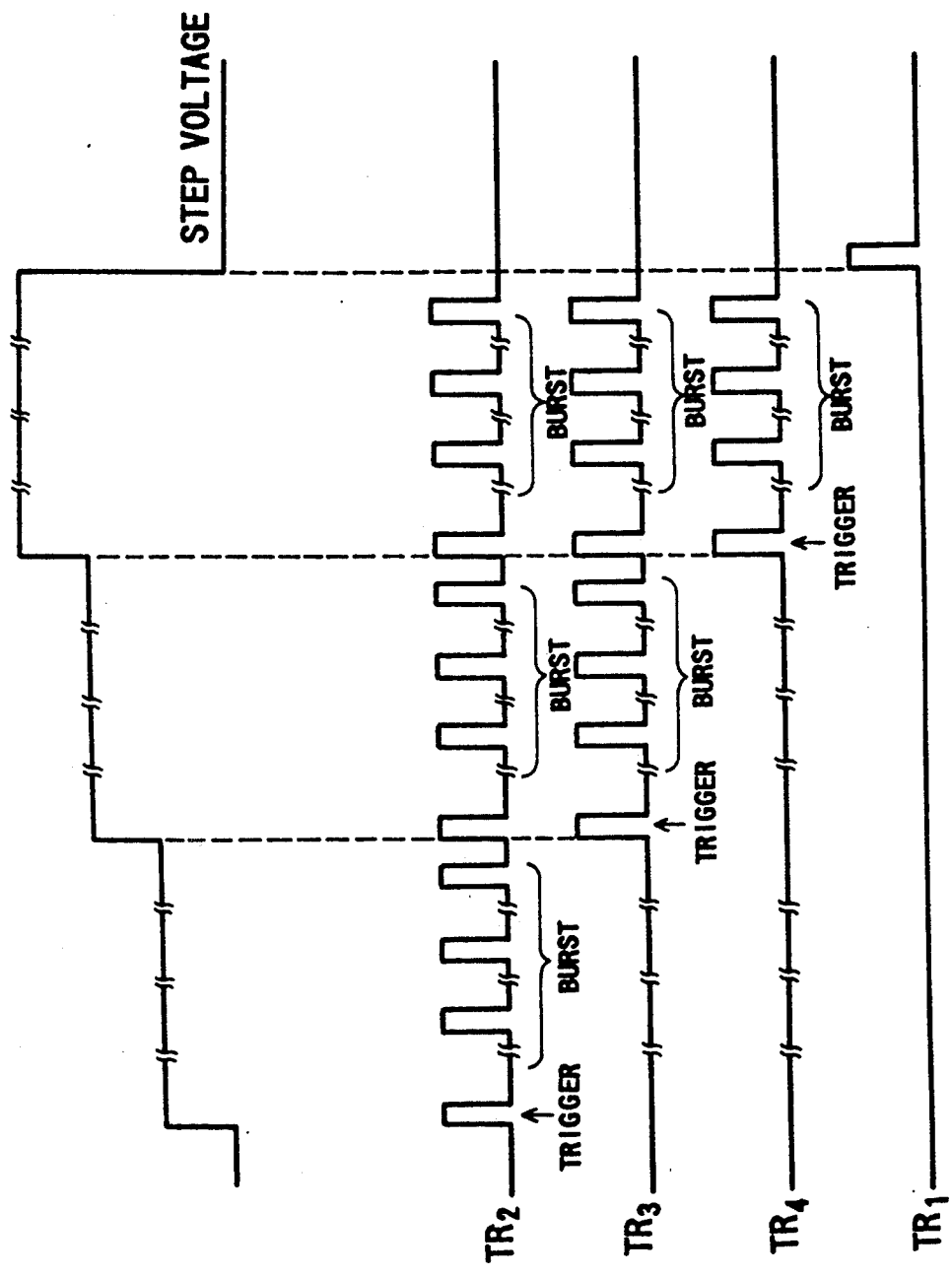
FIG. 6 is a timing chart of the step voltage generator according to the second embodiment.

In the circuit of FIG. 5, since the trigger means 4, and the FETs as the switch device S are interconnected by the pulse transformers, there is a possibility that the FETs turn from the ON-state to the OFF-state for a long period of time of a step width of a step voltage. In view of this, during a period of time in which the FETs (switch devices) are required to be in the ON-state, burst pulses are continuously supplied after the trigger pulses have been supplied, so as to supplement charges of the gates of the FETs. FIG. 6 shows the relationships among the trigger signals $TR_1$ to $TR_4$, the waveforms of step voltages, and burst pulses.

Figure 7:
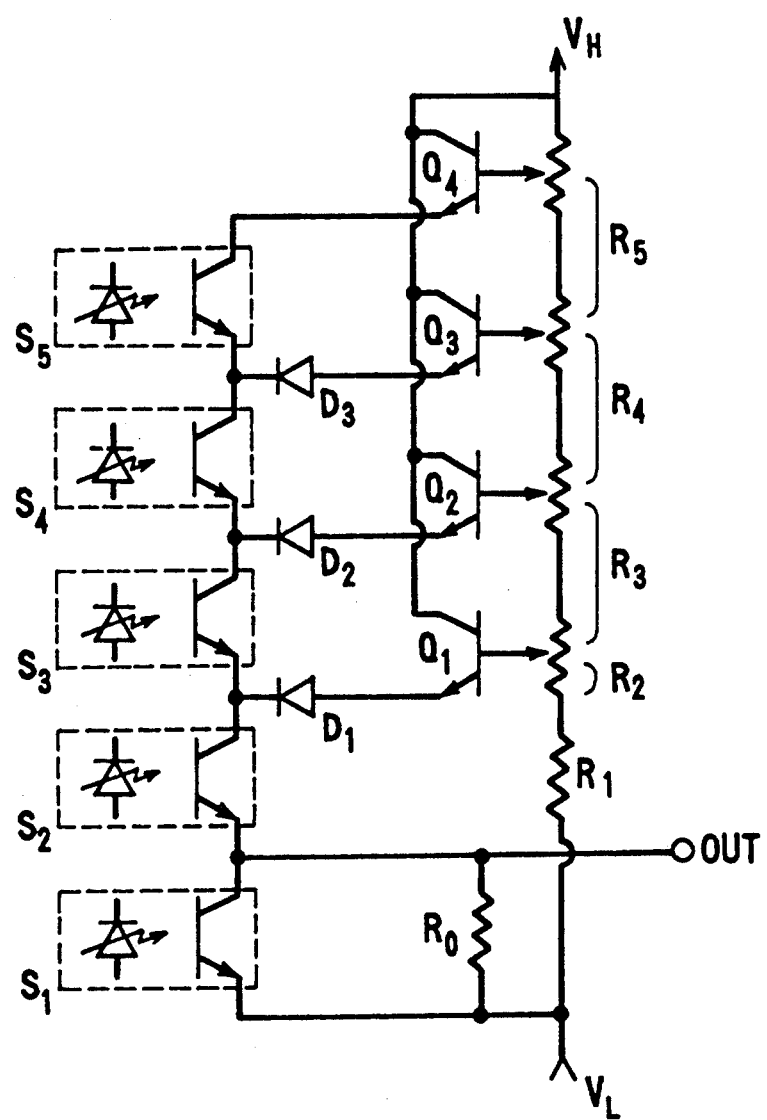
FIG. 7 is a block diagram of a major part of the step voltage generator according to a third embodiment of this invention.

FIG. 7 shows a major part of the step voltage generator according to a third embodiment of this invention. In this embodiment, the reset switch device $S_1$, and the switch devices $S_2$ to $S_5$ for stepping a voltage are provided by photocouplers. Thus the trigger means 4 and the switch device S for generating a high step voltage can be electrically insulated, so that, as in the second embodiment using pulse transformers, the floating for the power sources is facilitated.

Next, an example of a framing camera for which the step voltage generator of the present invention is applied will be explained.

Figure 8:
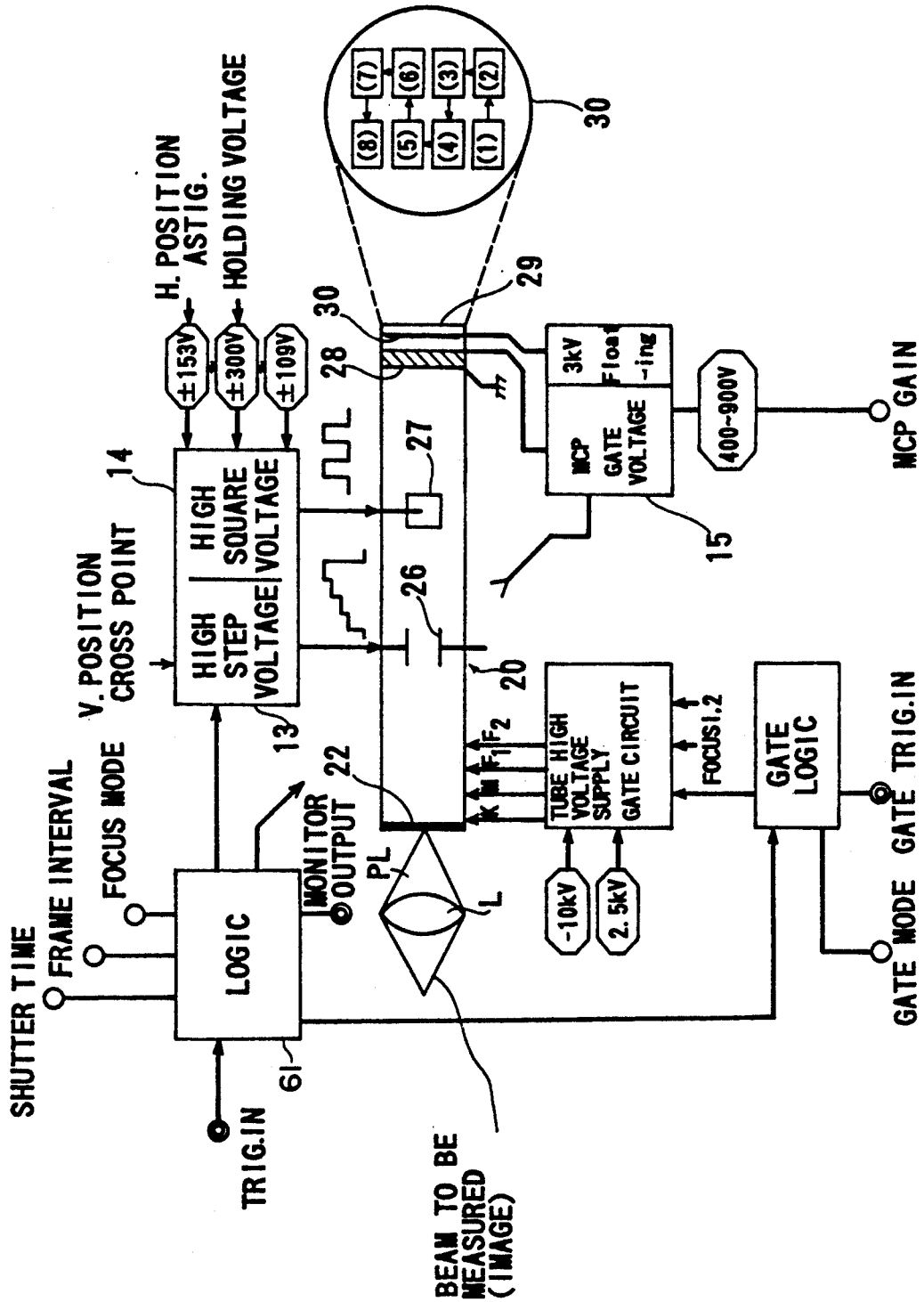
Figure 9A:
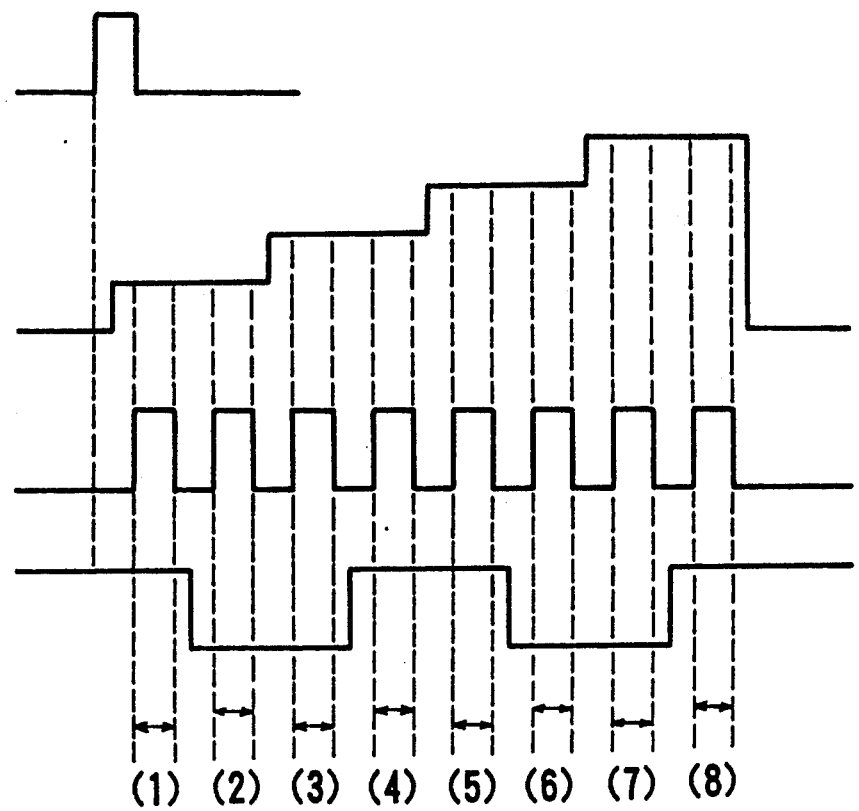
FIGS. 9A and 9B are timing charts of the operation of the framing camera.
Figure 9B:
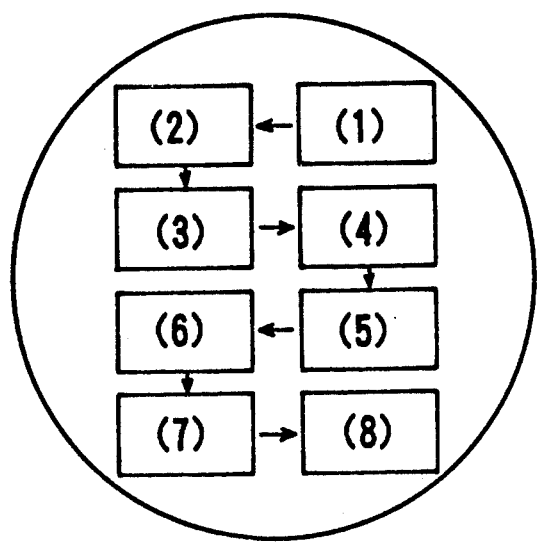

FIG. 8 is a block diagram of the example. FIGS. 9A and 9B are timing charts of the operation of the example. As shown in FIG. 8, a high step voltage (the second waveform of FIG. 9A) from a vertical deflection voltage generator 13 is supplied to a vertical deflection electrode 26 of a streak tube 20, and a high square voltage (the fourth waveform of FIG. 9A) from a horizontal deflection voltage generator 14 is supplied to a horizontal deflection electrode 27. A microchannel plate (MCP) 28 is supplied with an MCP gate voltage (the third waveform of FIG. 9A) from a gate voltage generator 15. The first uppermost waveform of FIG. 9A is of a trigger pulse TRIG. IN to be supplied to a logic circuit 61 of FIG. 8.

In this framing camera, when a beam to be measured (an image) is incident on a photo-emissive cathode of the streak tube 20, photoelectrons are emitted from the photocathode 22 and form an image on the MCP by means of an electron lens system. At this time, with a step voltage supplied to the vertical deflection electrode 26, the electron beam is deflected in the vertical direction in four steps in accordance with changes of the voltage. The electron beam which has been deflected in the vertical direction is further deflected in the horizontal direction in two steps. Accordingly 8(=4×2) frames of the image are formed on the MCP 28 at different positions. A gate voltage supplied to the MCP 28 functions as a shutter, so that eight frames of the image are formed on a fluorescent screen 30 as indicated by (1), (2), (3), . . . , (7), (8) in FIGS. 8 and 9B. These eight frames of the image correspond to those of the image of the measured beam in respective periods of time (1), (2), (3), . . . , (7), (8) shown at the bottom of FIG. 9A.

In the step voltage generator according to this invention, a step voltage is not necessarily changed from a low voltage to a high voltage but may be changed from a low to a high voltage by reversing the polarity of the devices or the power sources. In the embodiments, the generator is applied only to a framing camera, but the generator is applicable widely to CRTs, or others, which enable continuous image forming at high speed and high resolution. The voltage dividing function may be provided by resistors and Zener diodes, or Zener diodes alone.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

We claim:

1. A step voltage generator for outputting a step voltage from an output terminal, comprising:
   voltage dividing means comprising:
      a first circuit having a plurality of voltage dividing elements serially connected to each other between two power sources of different voltage levels; and
      a second circuit connected to said first circuit and having a plurality of transistors parallely connected to corresponding ones of said voltage dividing elements,
   wherein said voltage dividing means voltage divides a potential difference between said two power sources, and the base or gate of each of the transistors is supplied with a divided voltage output from a corresponding one of said plurality of voltage dividing elements;
   switch means comprising a third circuit disposed between said two power sources, said third circuit having a plurality of switch devices serially connected and associated with corresponding ones of said voltage dividing elements, wherein said output terminal is connected to one terminal of a switch device located nearest to one of said two power sources;
   trigger means for causing the switch devices to sequentially turn-on; and
   reverse flow preventive means for prohibiting current from a switch device which has been most recently turned on from flowing to a voltage dividing element corresponding to a switch device which had been previously turned on and remained on.

2. A step voltage generator for outputting a step voltage from an output terminal, comprising:
   voltage dividing means comprising:
      a first circuit having a plurality of voltage dividing elements serially connected to each other between two power sources of different voltage levels; and
      a second circuit connected to said first circuit and having a plurality of transistors parallely connected to corresponding ones of said voltage dividing elements,
   wherein said voltage dividing means voltage divides a potential difference between said two power sources, and the base or gate of each of the transistors is supplied with a divided voltage output from a corresponding one of said plurality of voltage dividing elements;
   switch means comprising a third circuit disposed between said two power sources, said third circuit having a plurality of switch devices serially connected and associated with corresponding ones of said voltage dividing elements, wherein said output terminal is connected to one terminal of a switch device located nearest to one of said two power sources;

a reset switch coupled at one terminal to said output terminal and at another terminal to one of said two power sources;

trigger means having a first state for sequentially turning on said serially connected switch devices starting with a serially connected switch device coupled to said output terminal, and a second state for turning off the serially connected switch devices and simultaneously turning on the reset switch; and reverse flow preventive means for prohibiting current from a serially connected switch device which has been most recently turned on by said trigger means from flowing to a voltage dividing element corresponding to a switch device which had been previously turned on and remained on.

3. A step voltage generator for outputting a step voltage from an output terminal, comprising:

voltage dividing means comprising a first circuit having a plurality of voltage dividing elements serially connected to each other between two power sources of different voltage levels;

switch means comprising a second circuit disposed between said two power sources, said second circuit having a plurality of switch devices serially connected, each of said voltage dividing elements being provided so as to correspond to each of said switch devices, said output terminal being connected to one terminal of a switch device which is located nearest to one of said two power sources;

trigger means for causing the switch devices to sequentially turn-on; and reverse flow preventive means for prohibiting current from a switch device which has been most recently turned on from flowing to a voltage dividing element corresponding to a switch device which had been previously turned on and remained on, said reverse flow preventive means comprising a plurality of diodes, and each diode being connected between one terminal of a respective switch device and a terminal of a corresponding voltage dividing element.

4. A step voltage generator for outputting a step voltage from an output terminal, comprising:

voltage dividing means comprising a first circuit having a plurality of voltage dividing elements serially connected between two power sources of different voltage levels;

switch means comprising a second circuit disposed between said two power sources, said second circuit having a plurality of switch devices serially connected, each of said voltage dividing elements being provided so as to correspond to each of said switch devices, wherein said output terminal is connected to one terminal of a switch device which is located nearest to one of said two power sources;

a reset switch coupled at one terminal to said output terminal, and at another terminal to one of said two power sources;

trigger means for causing the switch devices to sequentially turn on;

reverse flow preventive means for prohibiting current from a switch device which has been most recently turned on from flowing to a voltage dividing element corresponding to a switch device which had been previously turned on and remained on, said reverse flow preventive means comprising a plurality of diodes, and each diode being connected between one terminal of a respective switch device and a terminal of a corresponding voltage dividing element.

5. A step voltage generator according to claim 1, wherein the voltage dividing elements are resistors.

6. A step voltage generator according to claim 1, wherein the voltage dividing elements are resistors.

7. A step voltage generator according to claim 3, wherein the trigger means simultaneously turns on a plural number of said serially connected switch devices.

8. A step voltage generator according to claim 1, wherein the trigger means simultaneously turns on a plural number of the switch devices.

9. A step voltage generator according to claim 1, wherein the reverse flow preventive means comprises a plurality of diodes, each diode being connected between one terminal of a respective switch device and a terminal of a corresponding voltage dividing element.

10. A step voltage generator according to claim 1, wherein the output of the trigger means is supplied to the switch devices through pulse transformers.

11. A step voltage generator according to claim 1, wherein each of said serially connected switch devices includes a photocoupler.

12. A step voltage generator according to claim 4, wherein the voltage dividing elements are resistors.

13. A step voltage generator according to claim 2, wherein the voltage dividing elements are resistors.

14. A step voltage generator according to claim 4, wherein the trigger means simultaneously turns on a plural number of said serially connected switch devices.

15. A step voltage generator according to claim 2, wherein the trigger means simultaneously turns on a plural number of said serially connected switch devices.

16. A step voltage generator according to claim 2, wherein the reverse flow preventive means comprises a plurality of diodes, each diode being connected between one terminal of a respective switch device and a terminal of a corresponding voltage dividing element.

17. A step voltage generator according to claim 2, wherein the outout of the trigger means is supplied to the switch devices and the reset switch through pulse transformers.

18. A step voltage generator according to claim 2, wherein the switch devices and the reset switch include photocouplers.

* * * * *